(12) United States Patent
Lu et al.

(10) Patent No.: US 10,671,208 B2
(45) Date of Patent: Jun. 2, 2020

(54) DISPLAY PANEL AND DISPLAY DEVICE

(71) Applicant: SHANGHAI TIANMA MICRO-ELECTRONICS CO., LTD., Shanghai (CN)

(72) Inventors: Feng Lu, Shanghai (CN); Qijun Yao, Shanghai (CN); Liang Liu, Shanghai (CN); Conghua Ma, Shanghai (CN); Shaolong Ma, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 179 days.

(21) Appl. No.: 15/983,098

(22) Filed: May 18, 2018

(65) Prior Publication Data
US 2018/0267668 A1   Sep. 20, 2018

(30) Foreign Application Priority Data

Jan. 12, 2018  (CN) .......................... 2018 1 0031387

(51) Int. Cl.
| | |
|---|---|
| *G06F 3/041* | (2006.01) |
| *G01L 1/18* | (2006.01) |
| *G01L 1/22* | (2006.01) |
| *G11C 19/00* | (2006.01) |

(52) U.S. Cl.
CPC .............. *G06F 3/0416* (2013.01); *G01L 1/18* (2013.01); *G01L 1/2262* (2013.01); *G06F 3/0412* (2013.01); *G06F 3/0418* (2013.01); *G06F 2203/04105* (2013.01); *G11C 19/00* (2013.01)

(58) Field of Classification Search
CPC combination set(s) only.
See application file for complete search history.

(56) References Cited

U.S. PATENT DOCUMENTS

| | | | | |
|---|---|---|---|---|
| 2008/0122774 | A1* | 5/2008 | Jo ........................ | G09G 3/3677 345/94 |
| 2017/0277296 | A1* | 9/2017 | Reynolds ................ | G06F 3/044 |
| 2018/0333306 | A1* | 11/2018 | Ahong .................... | A61F 13/42 |

* cited by examiner

*Primary Examiner* — Temesghen Ghebretinsae
*Assistant Examiner* — Sosina Abebe
(74) *Attorney, Agent, or Firm* — Kilpatrick Townsend & Stockton, LLP

(57) ABSTRACT

The present disclosure provides display panel and display device. By adjusting positions of the input signal line and the output signal line of the force sensor, the problem that output signal of the force sensor in the existing display panel is interfered by signal transmitted on the peripheral circuit wirings. Non-display area of the display panel is provided with force sensor and driving circuit; the distance between an orthographic projection of the first output signal line of the force sensor on the display panel and an orthographic projection of the driving circuit input line on the display panel is at least 30 μm; and the distance between an orthographic projection of the second output signal line of the force sensor on the display panel and the orthographic projection of the driving circuit input line on the display panel is at least 30 μm.

10 Claims, 15 Drawing Sheets

DISPLAY PANEL AND DISPLAY DEVICE

CROSS-REFERENCE TO RELATED APPLICATIONS

The present application claims priority to Chinese Patent Application No. 201810031387.5, filed on Jan. 12, 2018, the content of which is incorporated herein by reference in its entirety.

TECHNICAL HELD

The present disclosure relates to the field of display technologies and, in particular, to a display panel and a display device.

BACKGROUND

With the development of the touch display technology, in addition to the conventional touch technology capable of detecting the touch position, a force touch technology capable of detecting a magnitude of a pressing force of a touch has emerged. By identifying the magnitude of the pressing force provided by the user, for example, by detecting three different force magnitudes which are a gentle touch, a gentle press, and a heavy press, the display device can make corresponding operation, which is beneficial for achieving more convenient human-computer interaction. The force sensor is a necessary component for achieving force touch, and how to improve the detection accuracy of the force sensor is an important technical problem in the industry.

SUMMARY

In view of this, the present disclosure provides a display panel and a display device, so as to improve the detection accuracy of the force sensor.

In a first aspect, the present disclosure provides a display panel, and the display panel includes a display area and a non-display area arranged in a row direction. The non-display area is provided with a force sensor and a driving circuit. The driving circuit includes a plurality of cascaded shift register units, and the force sensor is disposed between two adjacent shift register units of the plurality of cascaded shift register units. The display panel further includes a first input signal line connected to a first input of the force sensor, a second input signal line connected to a second input of the force sensor, a first output signal line connected to a first output of the force sensor, a second output signal line connected to a second output of the force sensor, and a driving circuit input line connected to an input of the driving circuit. An orthogonal projection of the first input signal line on the display panel is a first input signal line projection; an orthogonal projection of the second input signal line on the display panel is a second input signal line projection; an orthogonal projection of the first output signal line on the display panel is a first output signal line projection; an orthogonal projection of the second output signal line on the display panel is a second output signal line projection; and an orthogonal projection of the driving circuit input line on the display panel is a driving circuit input line projection. A distance between the first output signal line projection and the driving circuit input line projection is at least 30 μm; and a distance between the second output signal line projection and the driving circuit input line projection is at least 30 μm.

In a first aspect, the present disclosure provides a display device, and the display device included the above-described display panel.

Compared with the prior art, the display panel provided by the present disclosure at least has the following beneficial effects.

According to the display panel provided by the present disclosure, the distance between the first output signal line projection and the driving circuit input line projection is at least 30 μm, and the distance between the second output signal line projection and the driving circuit input line projection is at least 30 μm. Based on this structure, the first output signal line and the second output signal line can be kept away from the driving circuit input line so as to prevent the force detection signals transmitted on the first output signal line and the second output signal line from being interfered by the signal transmitted on the driving circuit input line, thereby improving the accuracy of the force detection. Moreover, it is only necessary to move the first output signal line and the second output signal line on the basis of the existing wiring manner without needing to change other wirings or introduce additional wirings, therefore, a possible change with respect to the overall wiring manner due to the introduction of additional wirings can be avoided and the process is easily implemented. In addition, it does not need to change the force sensor, and thus the influence on the detection accuracy of the force sensor is avoided while the anti-interference ability of the force sensor is improved.

BRIEF DESCRIPTION OF DRAWINGS

In order to more clearly illustrate technical solutions in embodiments of the present disclosure, the accompanying drawings used in the embodiments are briefly introduced as follows.

DESCRIPTION OF EMBODIMENTS

Figure 1:
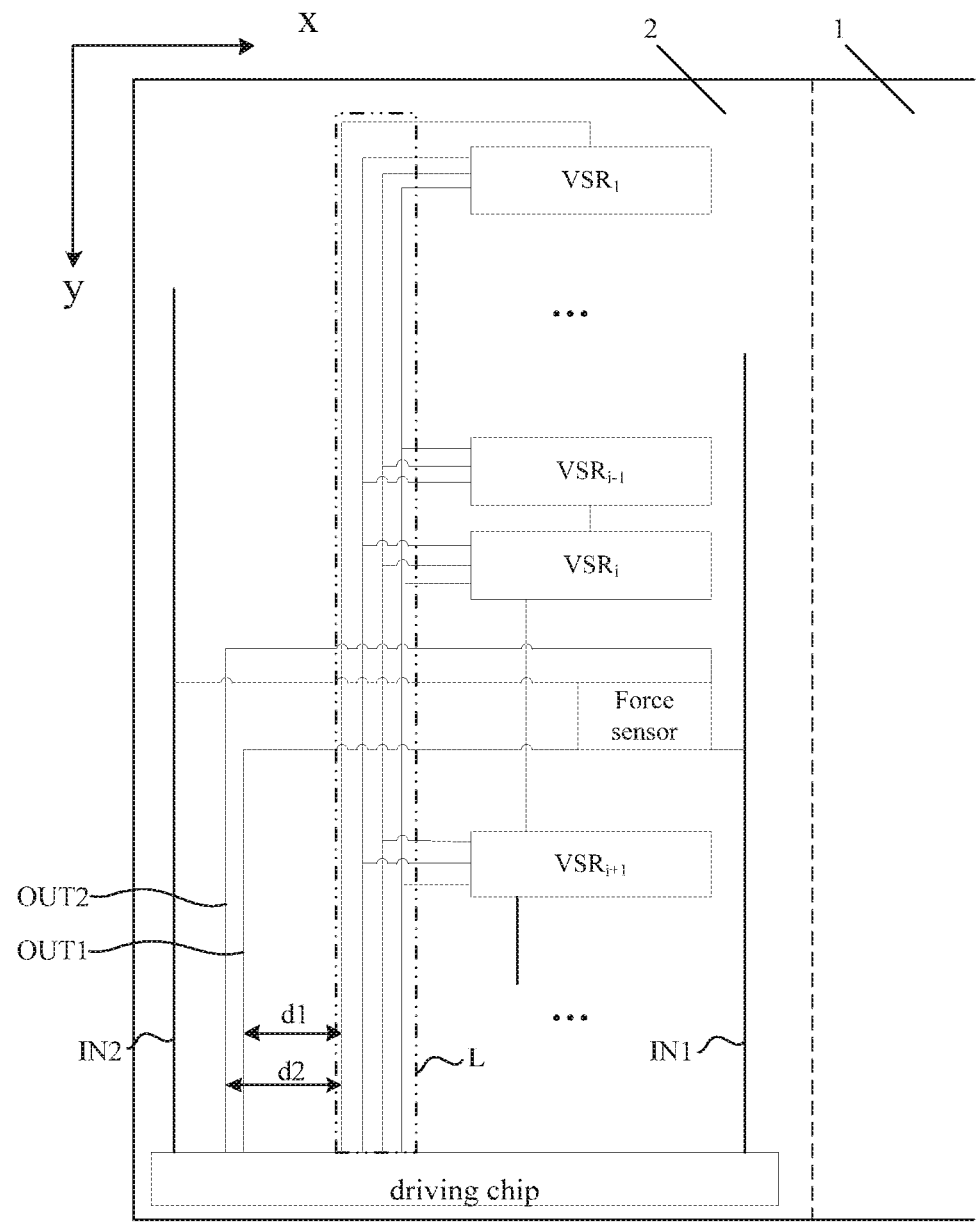
FIG. 1 is a first top view of a wiring of a partial area of a display panel provided by an embodiment of the present disclosure.

For better understanding the technical solutions of the present disclosure, the embodiments of the present disclosure will be described in detail as follows with reference to the accompanying drawings.

It should be noted that the described embodiments are merely exemplary embodiments of the present disclosure, which shall not be interpreted as limitations to the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to include plural form expressions thereof.

It should be understood that the term "and/or" used herein is merely an association relationship describing associated objects, indicating that there may be three relationships, for example, A and/or B may indicate that three cases, i.e., only A, both A and B, only B. In addition, the character "/" herein generally indicates that the related objects before and after the character are in an "or" relationship.

It should be noted that, in the actual manufacturing process, under the premise of achieving that the various wirings are insulated from one another, these wirings may be arranged in a same layer or may be arranged in different layers. The distances between the various wirings described in the embodiments are described based on the orientation shown in the drawings, and should not be construed as limitations to the present disclosure. It should be noted that the embodiment and features in the embodiments can be combined with one another if there is no conflict.

At present, in order to improve the detection accuracy of the force sensor and decrease the interference on the output signal of the force sensor by surrounding signals, there are generally two solutions to be taken, one of which is to additionally provide a shielding line between the output signal line of the force sensor and the noise source and input a constant-level signal to the shielding line so as to separate the output line of the force sensor from the noise source by the shielding line, and the other one of which is to increase the anti-noise ability of the force sensor by reducing the resistance value of the force sensor. However, during the study, the inventor found that, if a shielding line is added between the output line of the force sensor and the noise source, since an additional line is introduced, the wirings will be more complicated and the wiring difficulty will be increased; and if the resistance value of the force sensor is decreased, although the anti-noise ability of the force sensor is increased, the force range that the force sensor can detect is decreased, i.e., the detection accuracy of the force sensor is decreased. In view of this, in order to improve the anti-noise ability of the force sensor without reducing the detection accuracy of the force sensor and without complicating the wirings, the inventor proposed a display panel as shown in FIG. 1. FIG. 1 is a first top view of a wiring of a partial area of a display panel provided by an embodiment of the present disclosure. As shown in FIG. 1, the display panel includes a display area 1 and a non-display area 2 which are arranged in a row direction x, and the non-display area 2 surrounds the display area 1. The non-display area 2 is provided with a force sensor and a driving circuit; and as shown in FIG. 1, the driving circuit includes a plurality of cascaded shift register units $VSR_1, \ldots, VSR_{i-1}, VSR_i, VSR_{i+1}, \ldots$, and the force sensor is located between two adjacent shift register units.

A first input signal line is connected to a first input of the force sensor, a second input signal line is connected to a second input of the force sensor; a first output signal line is connected to a first output of the force sensor, and a second output signal line is connected to a second output of the force sensor, and a driving circuit input line is connected to an input of the driving circuit. The above-mentioned driving circuit input line, the first input signal line, the second input signal line, the first output signal line and the second output signal line are all located in the non-display area 2.

As shown in FIG. 1, an orthographic projection of the first input signal line on the display panel is a first input signal line projection IN1; an orthogonal projection of the second input signal line on the display panel is a second input signal line projection IN2; an orthographic projection of the first output signal line on the display panel is a first output signal line projection OUT1; an orthogonal projection of the second output signal line on the display panel is a second output signal line projection OUT2; and an orthographic projection of the driving circuit input line on the display panel is a driving circuit input line projection L. A distance d1 between the first output signal line projection OUT1 and the driving circuit input line projection L is at least 30 µm, and a distance d2 between the second output signal line projection OUT2 and the driving circuit input line projection L is at least 30 µm.

When the display panel is working, the driving chip inputs a bias voltage signal to the force sensor through the first input signal line and the second input signal line so as to make the force sensor work, and then the force sensor converts a detected force signal into an electrical signal, and the electrical signal is output to the driving chip through the first output signal line and the second output signal line to be processed, so as to calculate the force applied to the display panel; and the driving chip inputs a driving signal to the driving circuit through the driving circuit input line, so as to make the driving circuit work.

It should be understood that the driving chip shown in FIG. 1 is merely for describing the signal source or transmission direction of the first input signal line, the second input signal line, the first output signal line, the second output signal line, and the driving circuit input line, but is not intended to limit the position of the driving chip, and this is also applicable with respect to other accompanying drawings.

In this embodiment, a certain distance is set between the first output signal line and the driving circuit input line and between the second output signal line and the driving circuit input line, so that it is avoided that the force detection signal transmitted on the first output signal line and the second output signal line of the force sensor is interfered by the signal transmitted on the driving circuit input line when the display panel is working, thereby improving the accuracy of the force detection; moreover, it is only necessary for this solution to move the first output signal line and the second output signal line on the basis of the existing wiring manner without needing to change the other wirings or introduce additional wirings, therefore, a possible change with respect to the overall wiring manner due to the introduction of additional wirings can be avoided and the process is easily implemented. In addition, it does not need to change the force sensor, and thus the influence on the detection accuracy of the force sensor is avoided while the anti-interference ability of the force sensor is improved.

Figure 2:
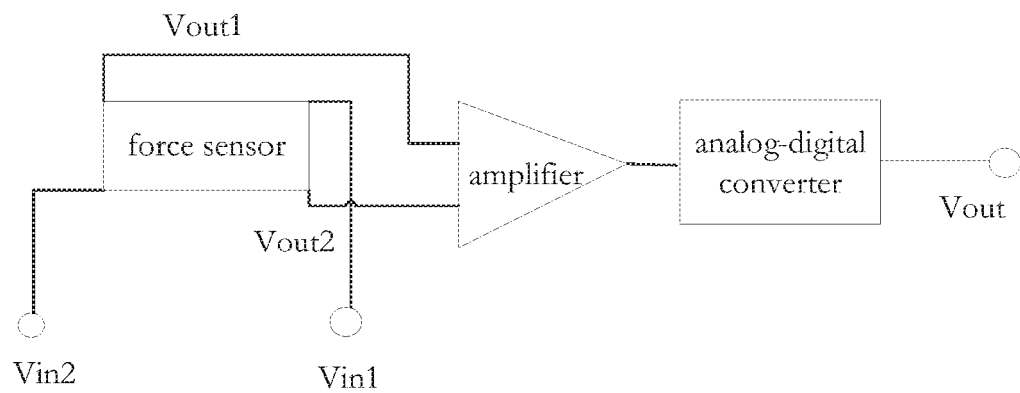
FIG. 2 is an equivalent circuit diagram when a noise test is carried on a display panel according to an embodiment of the present disclosure.
Figure 3:
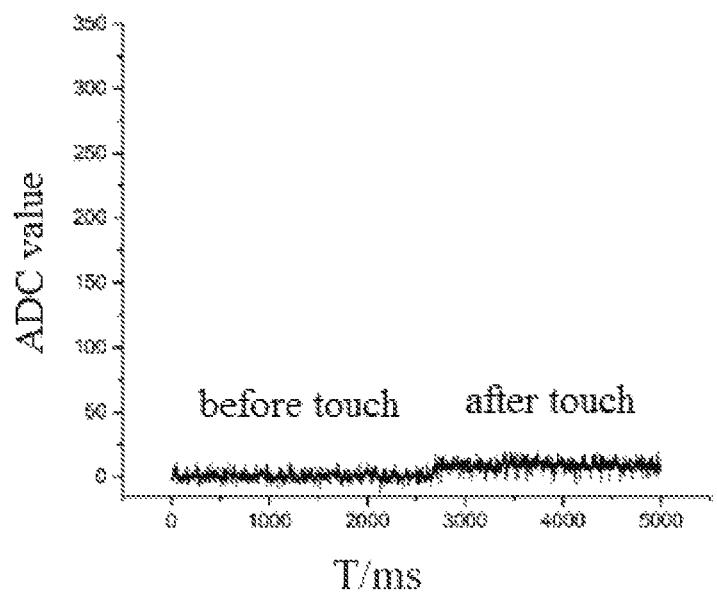
FIG. 3 shows a comparison diagram obtained from tests which compares noises generated on the output signals of the force sensor before and after the display panel is touched in a situation in which a distance between the first output signal line and the driving circuit input line is 30 μm and a distance between the second output signal line and the driving circuit input line is greater than 30 μm.
Figure 4:
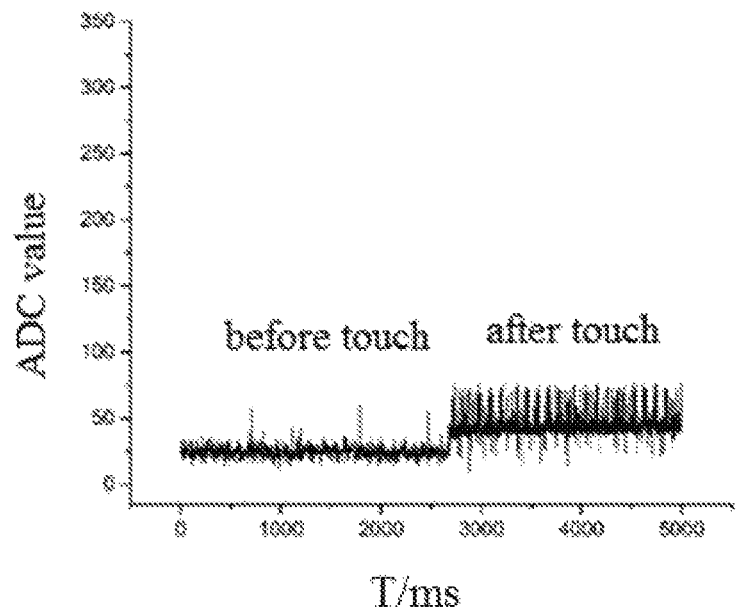
FIG. 4 shows a comparison diagram obtained from tests which compares noises generated on the output signals of the force sensor before and after the display panel is touched in a situation in which a distance between the first output signal line and the driving circuit input line is 20 μm and a distance between the second output signal line and the driving circuit input line is in a range of 20 μm-30 μm.
Figure 5:
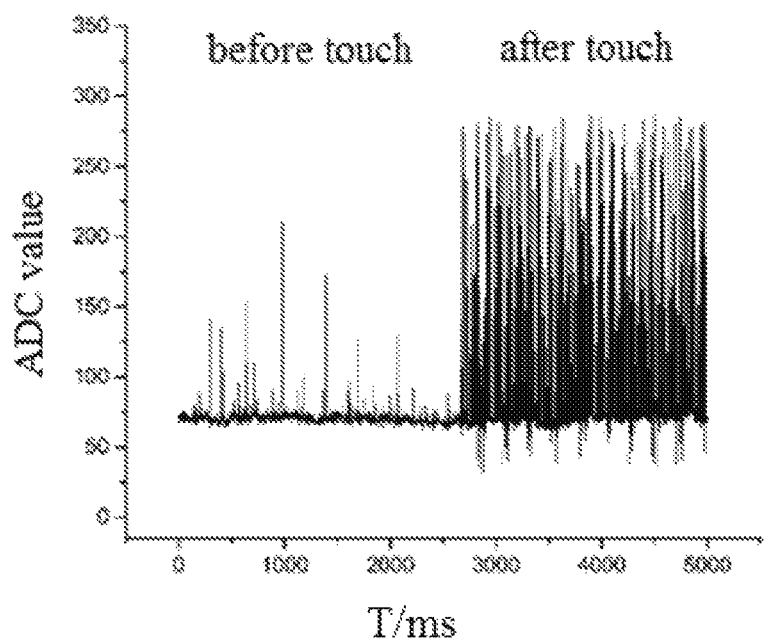
FIG. 5 shows a comparison diagram obtained from tests which compares noises generated on the output signals of the force sensor before and after the display panel is touched in a situation in which a distance between the first output signal line and the driving circuit input line is 10 μm and a distance between the second output signal line and the driving circuit input line is in a range of 10 μm-30 μm.

As shown in FIG. 2, FIG. 2 is an equivalent circuit diagram for detecting the output signal of the force sensor according to an embodiment of the present disclosure. In this embodiment, by following the circuit shown in FIG. 2, under the condition that the distance between the output signal line of the force sensor and the driving circuit input line is changed, the noise on the output signal of the force sensor is detected before and after the display panel is touched. Please refer to FIG. 3 to FIG. 5, where FIG. 3 shows a detected comparison diagram which compares noises generated on the output signals of the force sensor before and after the display panel is touched in a situation in which a distance between the first output signal line and the driving circuit input line is 30 µm and a distance between the second output signal line and the driving circuit input line is greater than 30 µm, FIG. 4 shows a detected comparison diagram obtained from the tests which compares noises generated on the output signals of the force sensor before and after the display panel is touched in a situation in which a distance between the first output signal line and the driving circuit input line is 20 µm and a distance between the second output signal line and the driving circuit input line is in a range of 20 µm-30 µm, FIG. 5 shows a detected comparison diagram which compares noises generated on the output signals of the force sensor before and after the display panel is touched in a situation in which a distance between the first output signal line and the driving circuit input line is 10 µm and a distance between the second output signal line and the driving circuit input line is in a range of 10 µm-30 µm. It can be seen that, compared with the situations shown in FIG. 4 and FIG. 5, when the distance between the first output signal line and the driving circuit input line is 30 µm and the distance between the second output signal line and the driving circuit input line is greater than 30 µm, the noise on the output signal of the force sensor does not significantly change before or after the display panel is touched, that is, after the display panel is touched, the output signal of the force sensor is not significantly interfered by the noise signal, the accuracy of the signal output by the force sensor is improved, thereby improving the accuracy of the force detection. Moreover, it is only necessary in this embodiment to move the first output signal line and the second output signal line on the basis of the existing wiring manner without needing to change the remaining wirings or introduce additional wirings, therefore, a possible change with respect to the overall wiring manner due to the introduction of additional wirings can be avoided and the process is easily implemented. In addition, it does not need to change the force sensor in this embodiment, and thus the influence on the detection accuracy of the force sensor is avoided while the anti-interference ability of the force sensor is improved.

Figure 6:
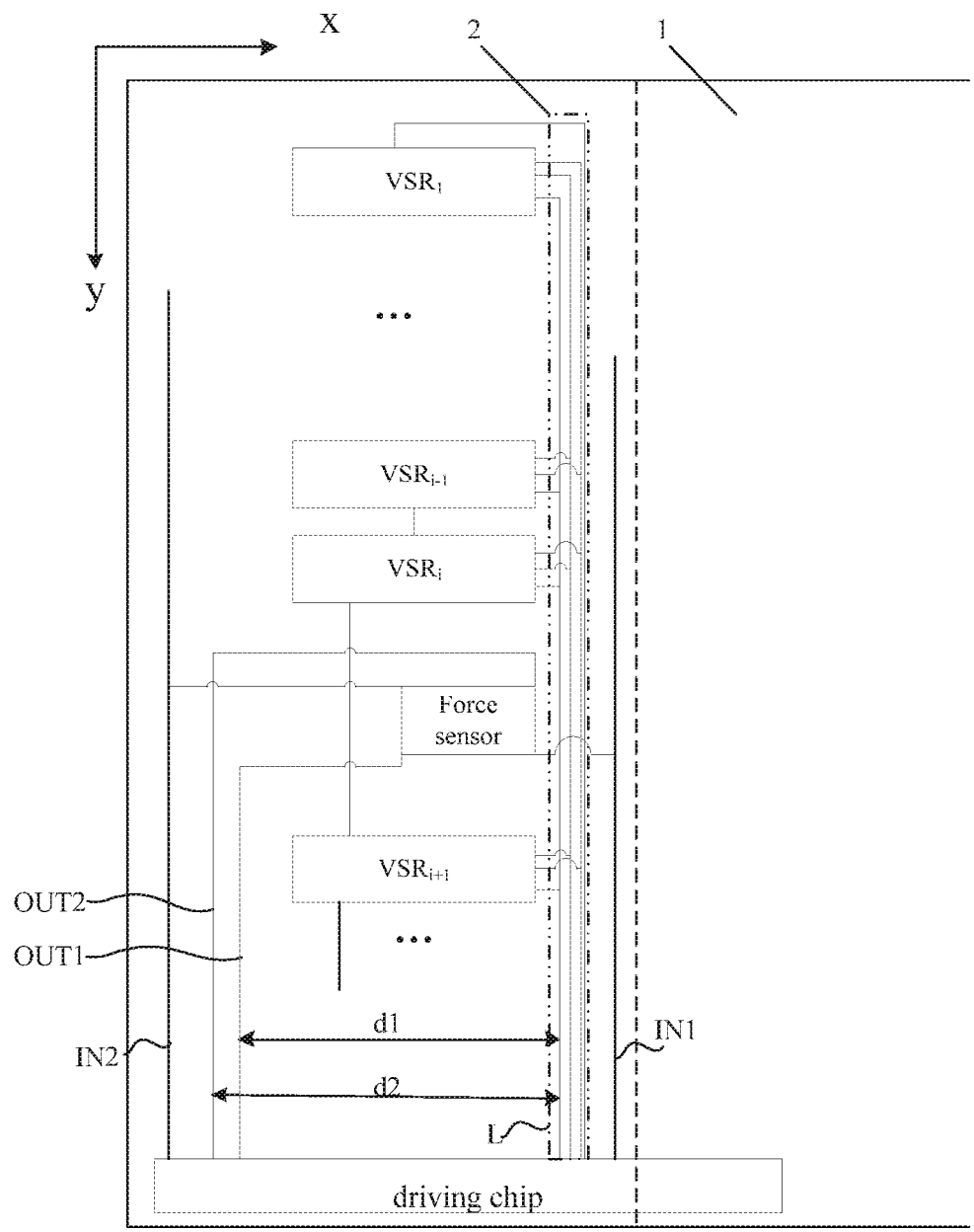
FIG. 6 is a second top view of a wiring of a partial area of a display panel provided by an embodiment of the present disclosure.

It should be understood that, in the above-mentioned embodiment, the wiring manner in the display panel is described by taking an example in which the driving circuit input line projection L is disposed on the left side of the shift register units. However, the actual implementation is not limited thereto. In fact, the positions of the shift register units and the driving circuit input line projection L may also be movable. In some other embodiments, on the basis of that the distance d1 between the first output signal line projection OUT1 and the driving circuit input line projection L is at least 30 µm, and the distance d2 between the second output signal line projection OUT2 and the driving circuit input line projection L is at least is 30 µm, the wiring can also be implemented as shown in FIG. 6. FIG. 6 is a second top view of wirings of a partial area of a display panel providing an embodiment of the disclosure. As shown in FIG. 6, the driving circuit input line projection L is disposed on the right side of the shift register units, and in this case, the distance d1 between the first output signal line and the driving circuit input line is greater than 30 µm, and the distance d2 between the second output signal line and the driving circuit input line is also greater than 30 µm.

Figure 7:
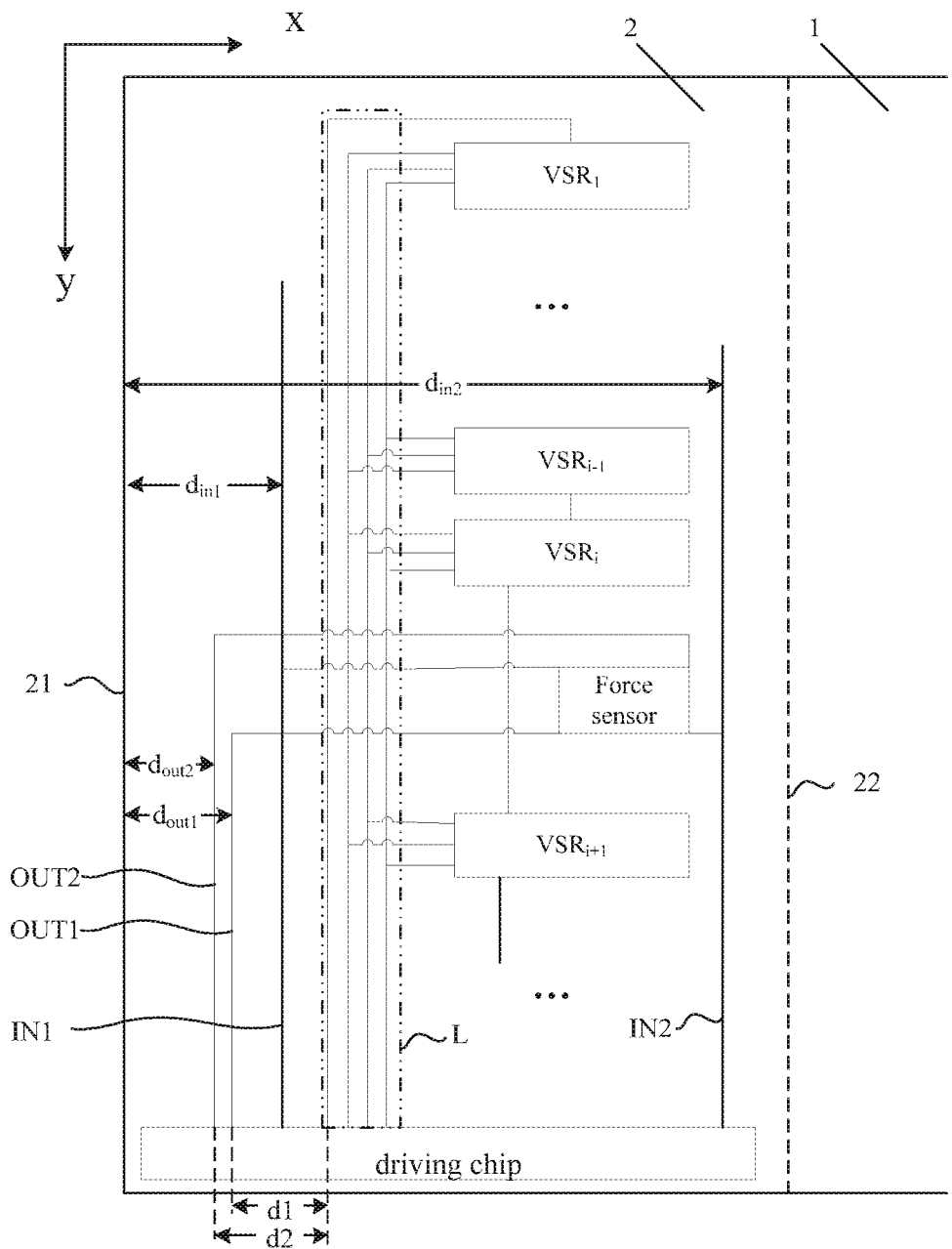
FIG. 7 is a third top view of a wiring of a partial area of a display panel provided by an embodiment of the present disclosure.
Figure 8:
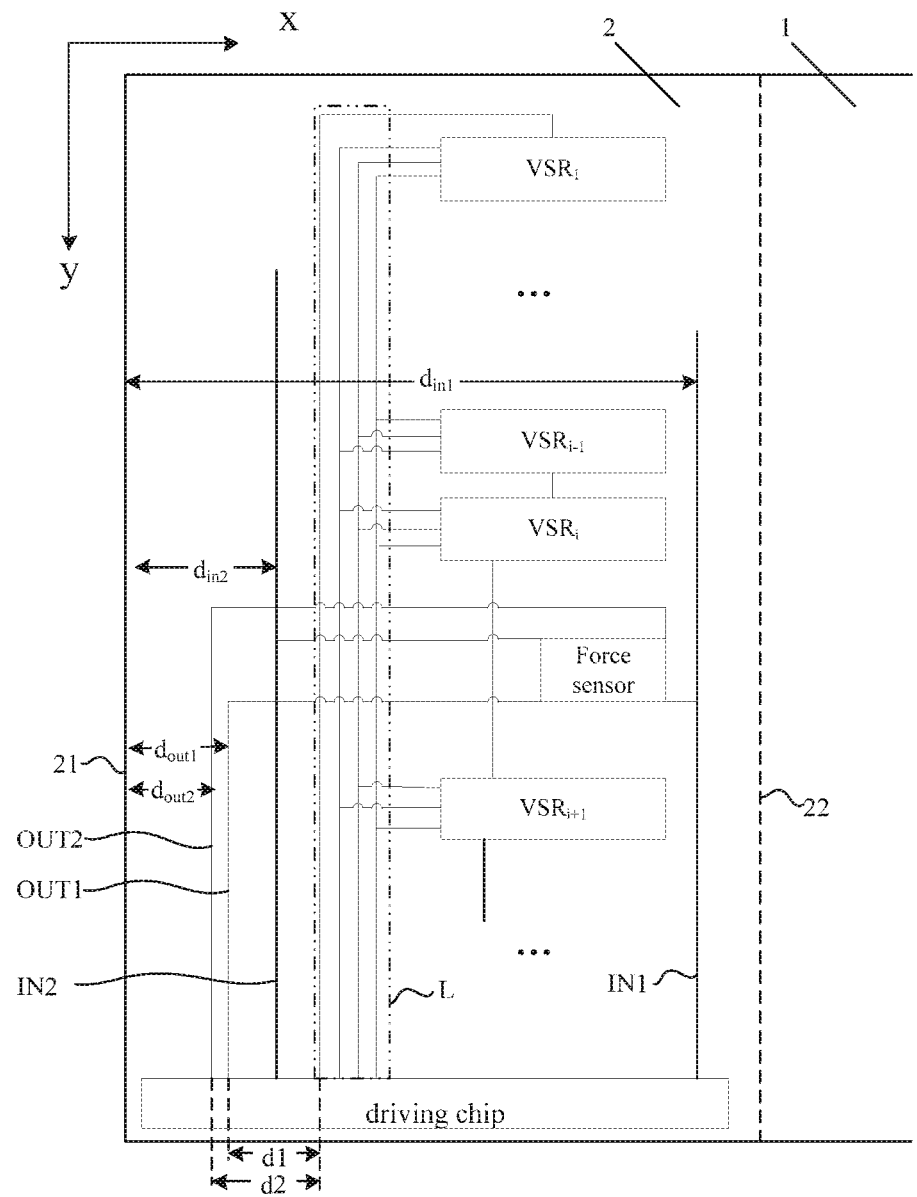
FIG. 8 is a fourth top view of a wiring of a partial area of a display panel provided by an embodiment of the present disclosure.

Further, on the basis of that the distance d1 between the first output signal line projection OUT1 and the driving circuit input line projection L is at least 30 µm and the distance d2 between the second output signal line projection OUT2 and the driving circuit input line projection L is at least is 30 µm, in order to further improve the anti-interference ability of the force sensor, the present disclosure also provides a display panel in FIG. 7. FIG. 7 is a third top view of a wiring of a partial area of a display panel provided by an embodiment of the present disclosure. As shown in FIG. 7, the first input signal line projection IN1 is disposed between the first output signal line projection OUT1 and the driving circuit input line projection L and the first input signal line projection IN1 is disposed between the second output signal line projection OUT2 and the driving circuit input line projection L; or as shown in FIG. 8, where FIG. 8 is a fourth top view of a wiring of a partial area of a display panel provided by an embodiment of the present disclosure, the second input signal line projection IN2 is disposed between the first output signal line projection OUT1 and the driving circuit input line projection L and the second input signal line projection IN2 is disposed between the second output signal line projection OUT2 and the driving circuit input line projection L.

On the basis that the distance d1 between the first output signal line projection OUT1 and the driving circuit input line projection L is at least 30 µm and the distance d2 between the second output signal line projection OUT2 and the driving circuit input line projection L is at least 30 μm, it can be implemented that the first input signal line or the second input signal line is disposed between the first output signal line and the driving circuit input line and between the second output signal line and the driving circuit input line, so that the first input signal line or the second input signal line separates the first output signal line and the second output signal line from the driving circuit input line, and the output signals transmitted on the two output signal lines can be protected from the interference of the signal transmitted on the driving circuit input line, thereby achieving the detection accuracy with respect to the force.

It should be understood that, when the force sensor is working, different types of bias voltage signals may be input to the input of the force sensor according to actual signal requirements. For example, when a constant potential signal is input to the first input signal line or the second input signal line, since the voltage in a constant potential wiring always remains constant, if the first input signal line or the second input signal line is close to the two output signal lines of the force sensor, then the first input signal line or the second input signal line on which the constant potential signal is transmitted will not interference with the signal transmitted on the two signal output lines of the force sensor, further, it is avoided that the signals of the output signal lines of the force sensor is interfered by the voltage jump on the driving circuit input circuit, thereby greatly improving the accuracy of the signals output by the force sensor through the output signal lines, and thus improving the accuracy of the force detection of the display panel provided by the embodiments.

In addition, in this case, since the first input signal line or the second input signal line is close to the driving circuit input line projection L, the input signal transmitted on the first input signal line or the second input signal line is easily interfered by the signal transmitted on the driving circuit input line; and since the force sensor has two outputs respectively connected to the first output signal line and the second output signal line, the final force detection signal is a difference between a first output signal and a second output signal when the force detection is performed, and the first output signal is a signal transmitted on the first output signal line, and the second output signal is a signal transmitted on the second output signal line. That is, the force sensor adopts a differential output mode. Therefore, when the signal transmitted on the first input signal line or the second input signal line is interfered and noise is generated, the noise entering the force sensor will influence the two output signals at the same time, that is, the signals transmitted on the first output signal line and the second output signal line are influenced by the noise synchronously, then the noise can be offset by a subtraction between the first output signal and the second output signal when calculating the final force detection signal. Therefore, when the first input signal line or the second input signal line is disposed between the first output signal line and the driving circuit input line and between the second output signal line and the driving circuit input line, even if the signal transmitted on the first input signal line or the second input signal line is interfered and noise is generated, the final output force detection signal will not be influenced by the noise due to the differential output, thereby improving the detection accuracy of the force detection. It should be noted that, if the distance between the first output signal line or the second output signal line and the driving circuit input line is less than 30 μm, the two output lines will be influenced by the driving circuit input line, and since the distance to the driving circuit input line may be varied for a different output signal line, the two output signal lines may be differently influenced, and the noises on the two output signal lines may also be different; therefore, when calculating the final force detection signal, although it is performed by the differential mode, the noise may not be offset by a subtraction between the first output signal and the second output signal. Therefore, when adopting the solution in which the first input signal line or the second input signal line is disposed between the first output signal line and the driving circuit input line and between the second output signal line and the driving circuit input line, it is still required that the distance d1 between the first output signal line projection OUT1 and the driving circuit input line projection L is at least 30 μm, and the distance d2 between the second output signal line projection OUT2 and the driving circuit input line projection L is at least 30 μm. The following description is also based on this setting unless otherwise specified.

Figure 9:
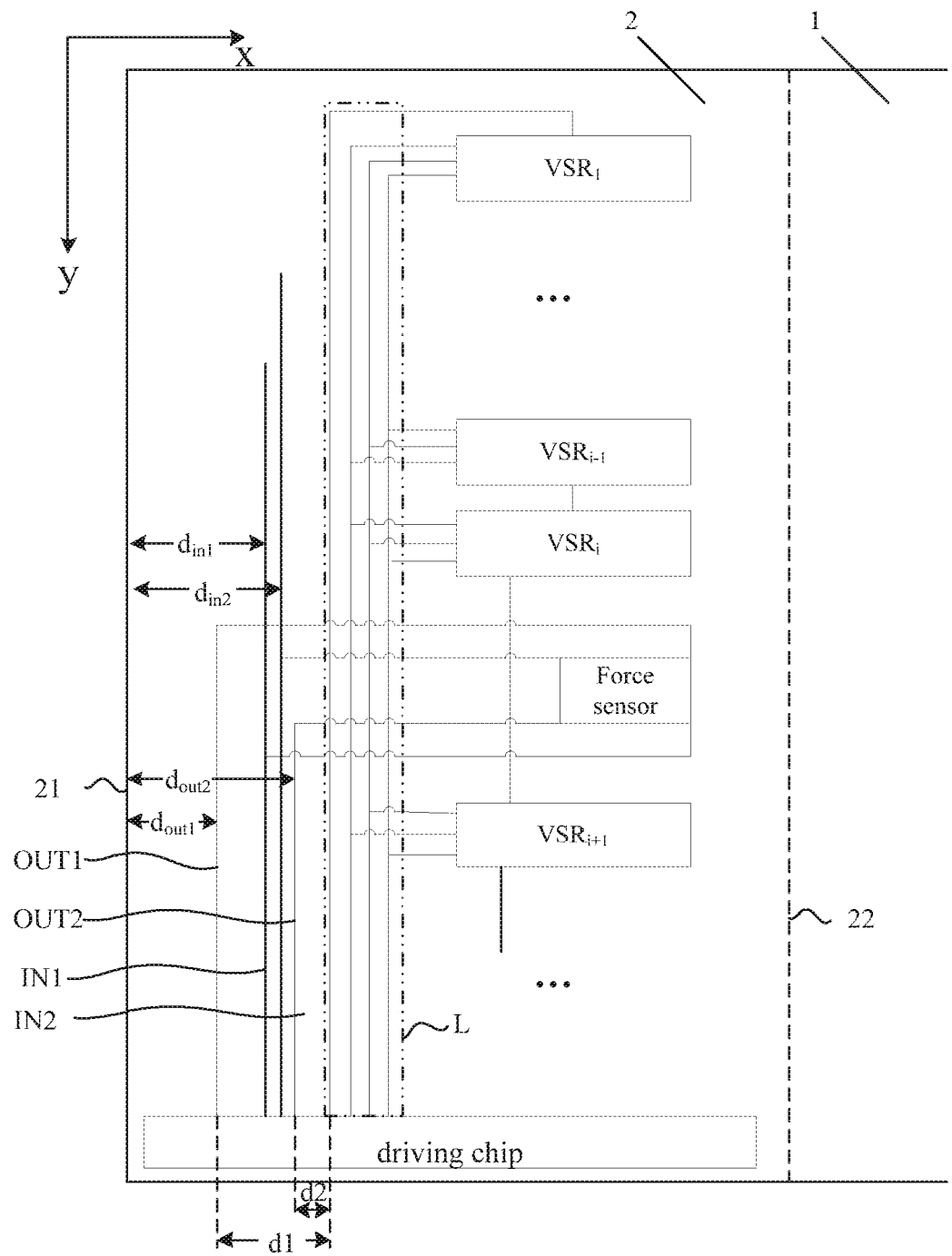
FIG. 9 is a fifth top view of a wiring of a partial area of a display panel provided by an embodiment of the present disclosure.
Figure 10:
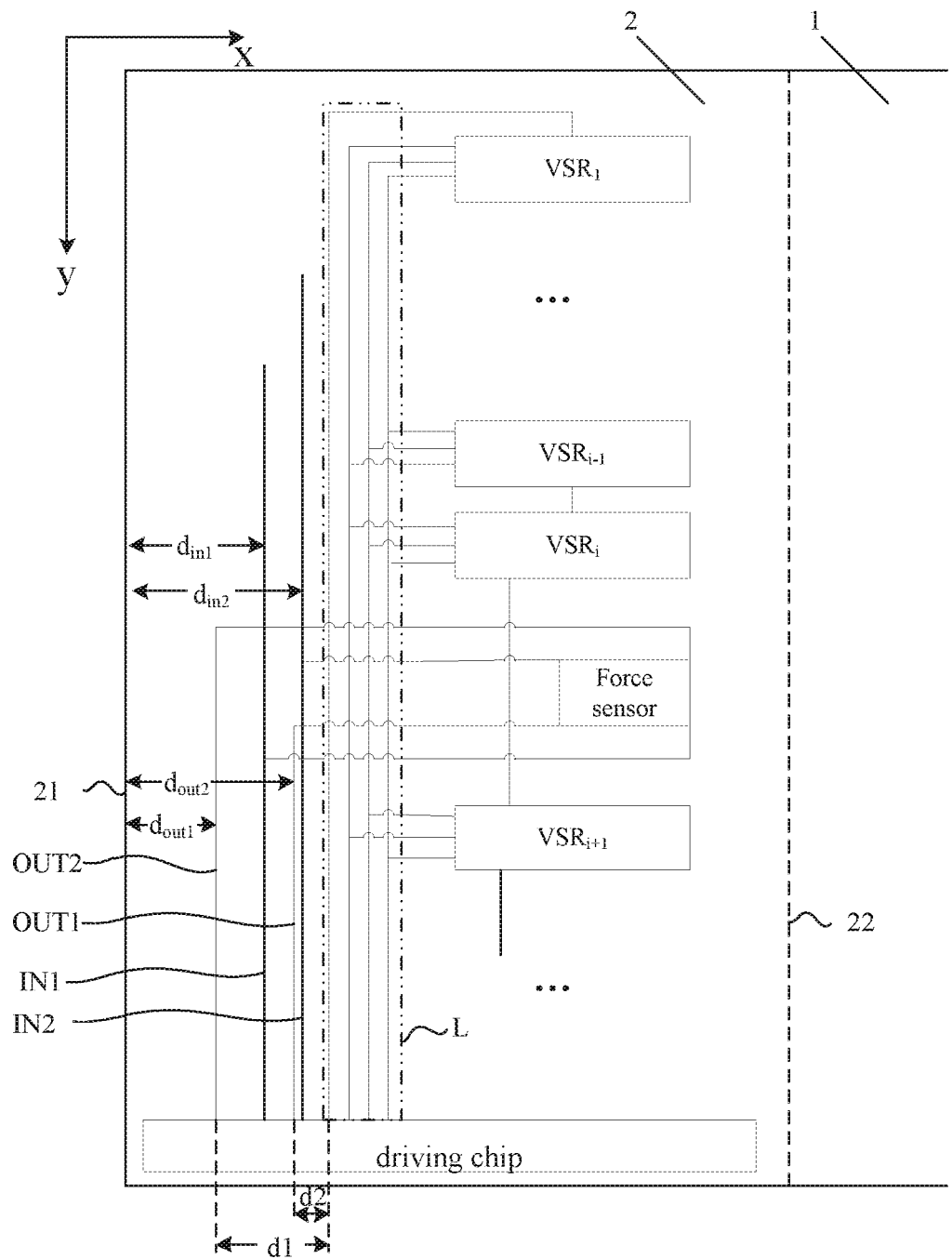
FIG. 10 is sixth top view of a wiring of a partial area of a display panel provided by an embodiment of the present disclosure.

It should be understood that the solutions shown in FIG. 7 and FIG. 8 are implemented by taking the example that the first output signal line is adjacent to the second output signal line, however, the present disclosure is not limited thereto. It is also implementable that the first output signal line is not adjacent to the second output signal line, as shown in FIG. 9 and FIG. 10, and FIG. 9 is a fifth top view of a wiring of a partial area of a display panel provided by an embodiment of the present disclosure and FIG. 10 is a sixth top view of a wiring of a partial area of a display panel provided by an embodiment of the present disclosure. As shown in FIG. 9, the first input signal line projection IN1 is disposed between the first output signal line projection OUT1 and the second output signal line projection OUT2, and the second output signal line projection OUT2 is disposed between the first input signal line projection IN1 and the second input signal line projection IN2. As shown in FIG. 10, the first input signal line projection IN1 is disposed between the second output signal line projection OUT2 and the first output signal line projection OUT1 and the first output signal line projection OUT1 is disposed between the first input signal line projection IN1 and the second input signal line projection IN2.

Figure 11:
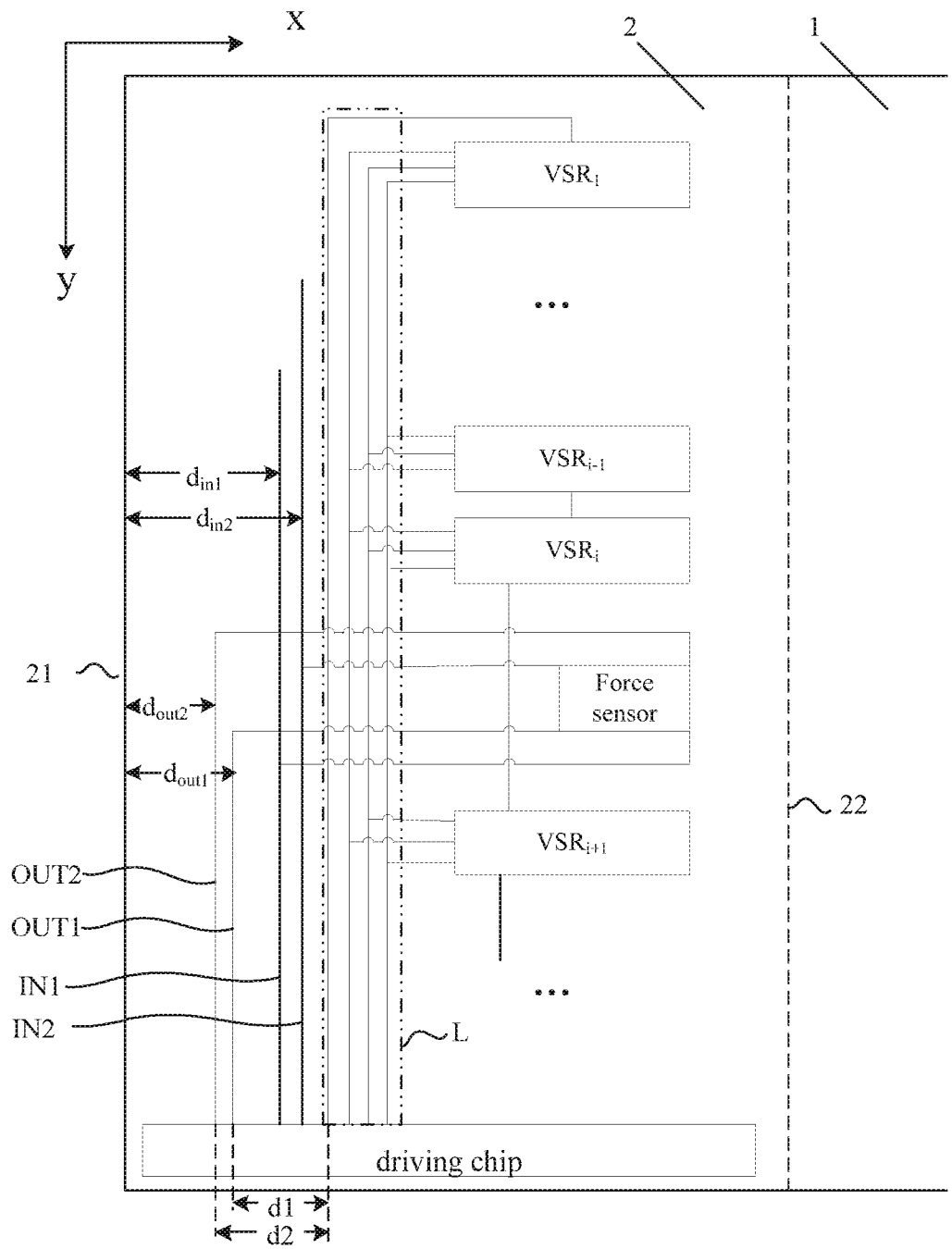
FIG. 11 is a seventh top view of a wiring of a partial area of a display panel provided by an embodiment of the present disclosure.

Exemplarily, in addition to the cases shown in FIGS. 7-10 described above, on the basis that the distance d1 between the first output signal line projection OUT1 and the driving circuit input line projection L is at least 30 μm and the distance d2 between the second output signal line projection OUT2 and the driving circuit input line projection L is at least is 30 μm, in order to further improve the anti-interference ability of the force sensor, the present disclosure further provides a display panel as shown in FIG. 11, where FIG. 11 is a seventh top view of a wiring of a partial area of a display panel provided by an embodiment of the present disclosure. As shown in FIG. 11, both the first input signal line projection IN1 and the second input signal line projection IN2 are disposed between the first output signal line projection OUT1 and the driving circuit input line projection L, and both the first input signal line projection IN1 and the second input signal line projection IN2 are disposed between the second output signal line projection OUT2 and the driving circuit input line projection L. Compared with the cases shown in FIGS. 7-10, in this embodiment, both the first input signal line and the second input signal line are disposed between the two output signal lines and the driving circuit input line, which further prevents the two output signal lines from being interfered by the signal transmitted on the driving circuit input line, thereby further improving the detection accuracy of the force detection. Moreover, it is only necessary for this solution to change the relative positions of the first input signal line, the second input signal line, the first output signal line, and the second output signal line on the basis of the existing wiring manner without needing to change other wirings or introduce additional wirings, therefore, a possible change with respect to the overall wiring manner due to the introduction of additional wirings can be avoided and the process is easily implemented. In addition, it does not need to modify the force sensor in this embodiment, and thus the influence on the detection accuracy of the force sensor is also avoided while the anti-interference ability of the force sensor is improved.

Figure 12:
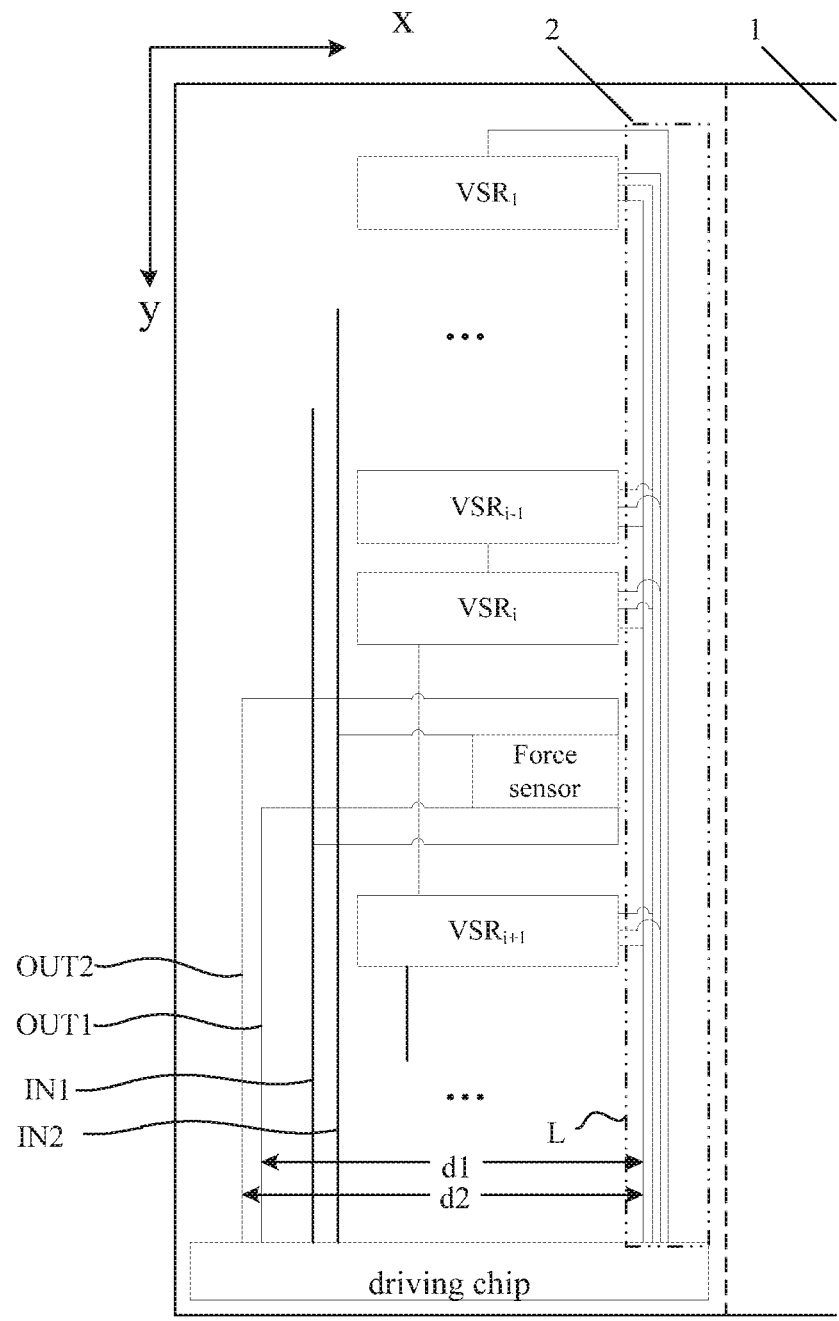
FIG. 12 is an eighth top view of a wiring of a partial area of a display panel provided by an embodiment of the present disclosure.
Figure 13:
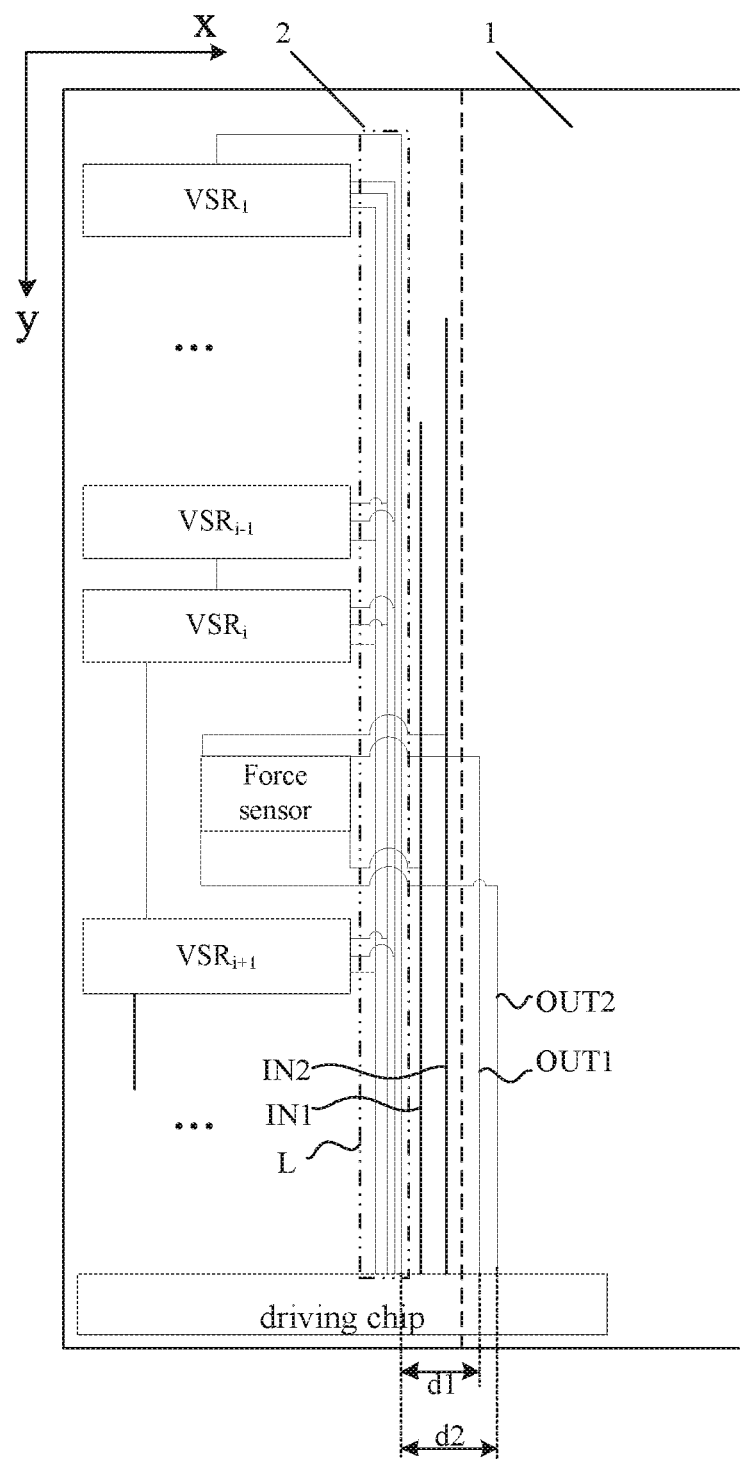
FIG. 13 is a ninth top view of a wiring of a partial area of a display panel provided by an embodiment of the present disclosure.

It should be understood that wiring manners in the display panel provided by the embodiments are described above on the basis of a situation in which the driving circuit input line is disposed on the left side of the shift register units and the driving circuit input line is adjacent to the shift register units, however the present disclosure is not limited thereto. In fact, the positions of the shift register units and the driving circuit input line may also be changed. In some other embodiments, on the basis that the distance d1 between the first output signal line projection OUT1 and the driving circuit input line projection L is at least 30 μm, the distance d2 between the second output signal line projection OUT2 and the driving circuit input line projection L is at least is 30 μm, both the first input signal line projection IN1 and the second input signal line projection IN2 are disposed between the first output signal line projection OUT1 and the driving circuit input line projection L, and both the first input signal line projection IN1 and the second input signal line projection IN2 are disposed between the second output signal line projection OUT2 and the driving circuit input line projection L, the wiring can also be implemented according to FIGS. 12-13. For example, FIG. 12 is an eighth top view of a wiring of a partial area of a display panel provided by an embodiment of the present disclosure, and the driving circuit input line projection L is disposed on the right side of the shift register units; and FIG. 13 is a ninth top view of a wiring of a partial area of a display panel provided by an embodiment of the present disclosure, and the driving circuit input line projection L is also disposed on the right side of the shift register units.

In some other embodiments, the driving circuit input line, the first input signal line, the second input signal line, the first output signal line, and the second output signal line may all be arranged on a same side of the shift register units away from the display area. For example, as shown in FIGS. 9-11, the driving circuit input line, the first input signal line, the second input signal line, the first output signal line, and the second output signal line are all arranged on the left side of the shift register units so as to avoid interference on the gate line or data line located in the display area, which may affect the display effect.

In one embodiment, with further reference to FIGS. 7-11, the above-mentioned non-display area 2 includes a first edge 21 and a second edge 22 which are arranged in a row direction x and extend along a column direction. A distance between the first input signal line projection IN1 and the first edge 21 is a first input signal line distance $d_{in1}$, a distance between the second input signal line projection IN2 and the first edge 21 is a second input signal line distance $d_{in2}$, a distance between the first output signal line projection OUT1 and the first edge 21 is a first output signal line distance $d_{out1}$, and a distance between the second output signal line projection OUT2 and the first edge 21 is a second output signal line distance $d_{out2}$. The first input signal line distance $d_{in1}$ is greater than at least one of the first output signal line distance $d_{out1}$ or the second output signal line distance and the second input signal line distance $d_{in2}$ is greater than at least one of the first output signal line distance $d_{out1}$ or the second output signal line distance $d_{out2}$. FIG. 9 is a schematic diagram of a display panel according to an embodiment in which the first input signal line distance $d_{in1}$ is greater than the first output signal line distance $d_{out1}$, and the second input signal line distance $d_{in2}$ is greater than the first output signal line distance $d_{out1}$; FIG. 10 a schematic diagram of a display panel according to an embodiment in which the first input signal line distance $d_{in1}$ is greater than the second output signal line distance $d_{out2}$, and the second input signal line distance $d_{in2}$ is greater than the second output signal line distance $d_{out2}$; FIG. 7, FIG. 8 and FIG. 11 each is a schematic diagram of a display panel according to an embodiment in which the first input signal line distance $d_{in1}$ is greater than the first output signal line distance $d_{out1}$ and the second output signal line distance $d_{out2}$, and the second input signal line distance $d_{in2}$ is greater than the first output signal line distance $d_{out1}$ and the second output signal line distance $d_{out2}$.

In some embodiments, during the production, storage, installation, and use of the display panel, static electricity is easily generated at an edge of the display panel, and the arrangement of various metal wirings in the display panel may easily cause the static electricity to enter the inside of the display panel from the edge of the display panel. The input signal lines of the force sensor is weak in bearing static electricity, therefore, it is proposed in this embodiment that the two input signal lines of the force sensor are disposed as far away from the edge of the display panel as possible so as to prevent static electricity from entering the input signal lines and damaging the force sensor. In comparison, since the resistances of the output signal lines are relatively great and the ability for bearing static electricity is relatively strong, the output signal lines can be arranged as close as possible to the edge of the display panel, and the input signal lines can be arranged away from the edge of the display panel, so that the input signal lines may be influenced as less as possible by the static electricity generated at the edge.

Figure 14:
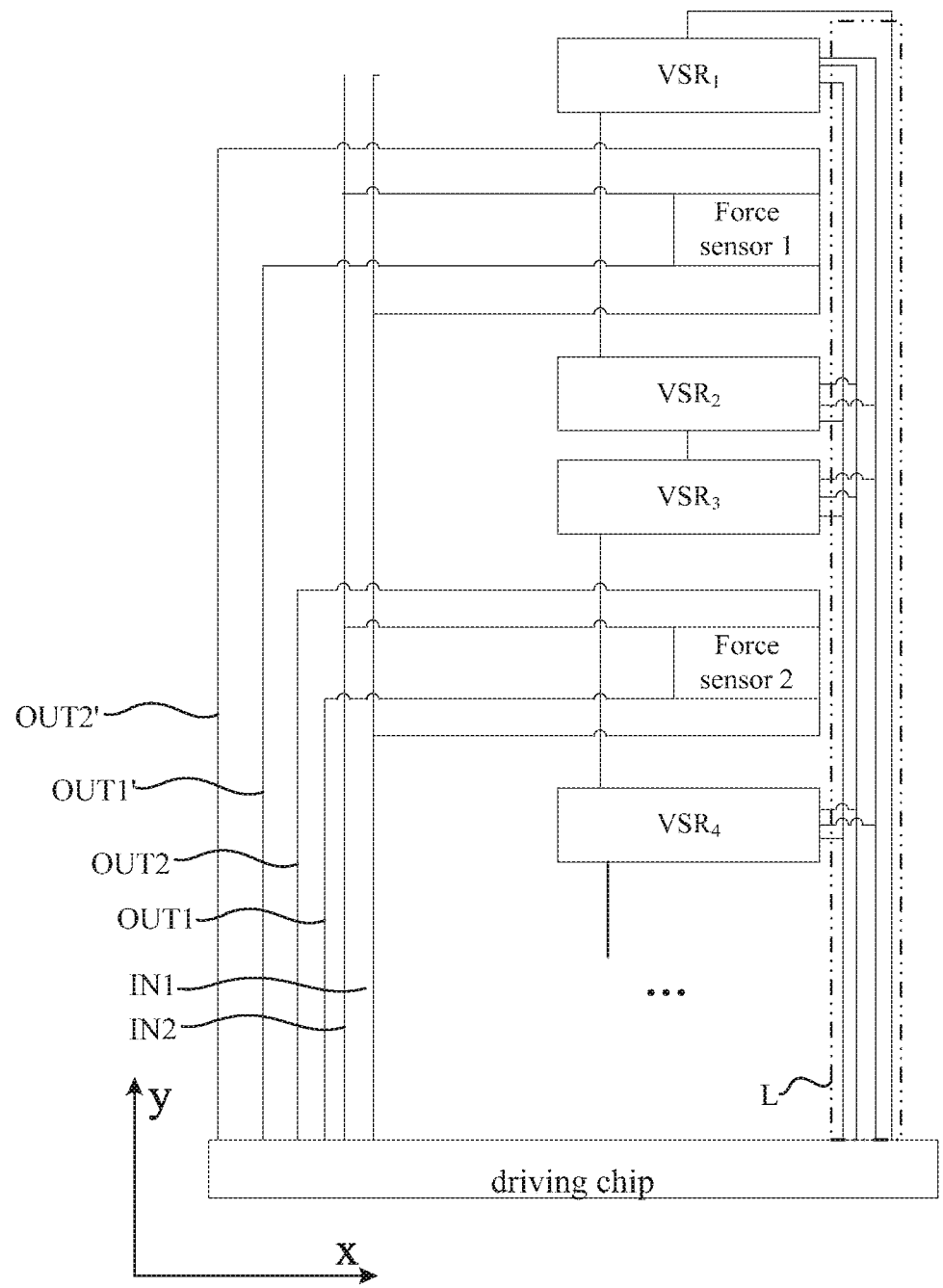
FIG. 14 is a schematic diagram of a display panel including a plurality of force sensors provided by an embodiment of the present disclosure.

In one embodiment, in order to improve the accuracy of force detection, the display panel is usually provided with a plurality of force sensors, and correspondingly, a plurality of first output signal lines is included. As shown in FIG. 14, where FIG. 14 is a schematic diagram of a display panel including a plurality of force sensors provided by an embodiment of the present disclosure, a force sensor 1 is provided with a first output signal line OUT1' and a second output signal line OUT2', and a force sensor 2 is provided with a first output signal line OUT1' and a second output signal line OUT2; the first output signal line OUT1' is connected to a first output of the force sensor 1, the second output signal line OUT2' is connected to a second output of the force sensor 1, the first output signal line OUT1 is connected to a first output of the force sensor 2, and the second output signal line OUT2 is connected to a second output of the force sensor 2.

Since each force sensor outputs signals through two output signal lines, that is, each force sensor adopts the above-mentioned differential output mode, on the basis that the distance d1 between the first output signal line projection and the driving circuit input line projection L is at least 30 μm, the distance d2 between the second output signal line projection and the driving circuit input line projection L is at least is 30 μm, both the first input signal line projection and the second input signal line projection are disposed between the first output signal line projection and the driving circuit input line projection, and both the first input signal line projection and the second input signal line projection are disposed between the second output signal line projection and the driving circuit input line projection L, since the first input signal line IN1 or the second input signal line IN2 is relatively close to the driving circuit input line, the input signal transmitted on the first input signal line IN1 or the second input signal line IN2 at this time is easily interfered by the signal transmitted on the driving circuit input line, and since each force sensor in this embodiment includes two outputs, after the signal transmitted on the first input signal line or the second input signal line is influenced by noise, the signals on both of the two output signal lines will be influenced, however, since the final output value is a difference between the two output signals, the subtraction offsets the influence of this noise, therefore, the influence of the noise on the final output force detection signal can be decreased due to the differential output, thereby improving the detection accuracy of the force detection.

With further reference to FIG. 14, the display panel provided by the embodiment includes only one first input signal line IN1 and one second input signal line IN2, and this first input signal line IN1 is electrically connected to the first input of each force sensor, and this second input signal line IN2 is electrically connected to the second input of each force sensor, so as to reduce the number of the wirings, which is beneficial for the narrowing of the border of the display panel. When the display panel is working, the two input signal lines can be connected to the driving chip so as to provide a bias voltage signal to the force sensors by using the driving chip.

Exemplarily, the above-mentioned driving circuit may be a gate driving circuit for providing a scanning signal to the display panel, a touch driving circuit for providing a touch signal to the display panel, or other driving circuit. Correspondingly, the gate driving circuit is connected to the driving chip by the above-mentioned driving circuit input line; and the touch driving circuit is connected to the driving chip by the above-mentioned driving circuit input line.

Figure 15:
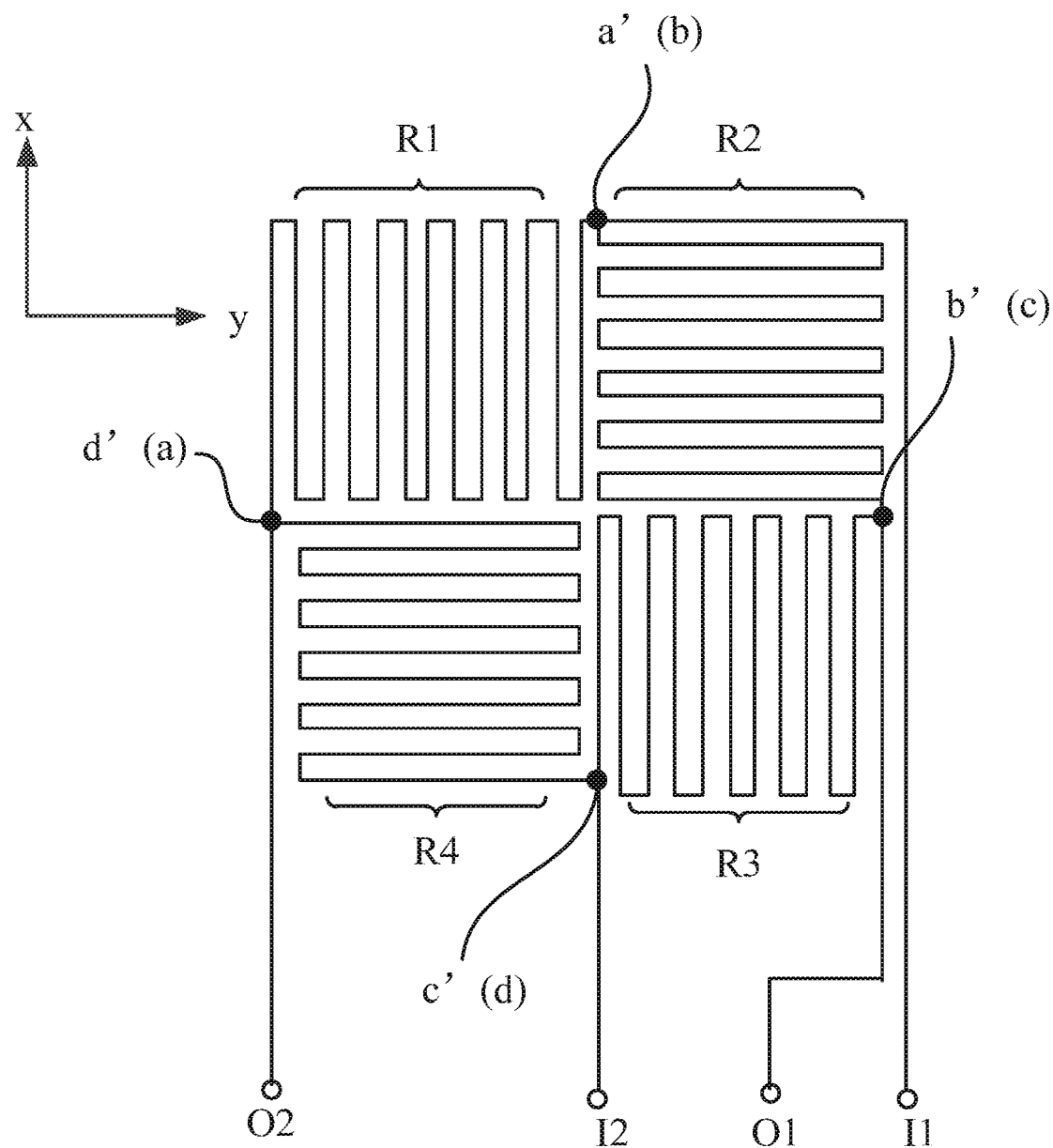
FIG. 15 is a structural schematic diagram of a force sensor provided by an embodiment of the present disclosure.
Figure 16:
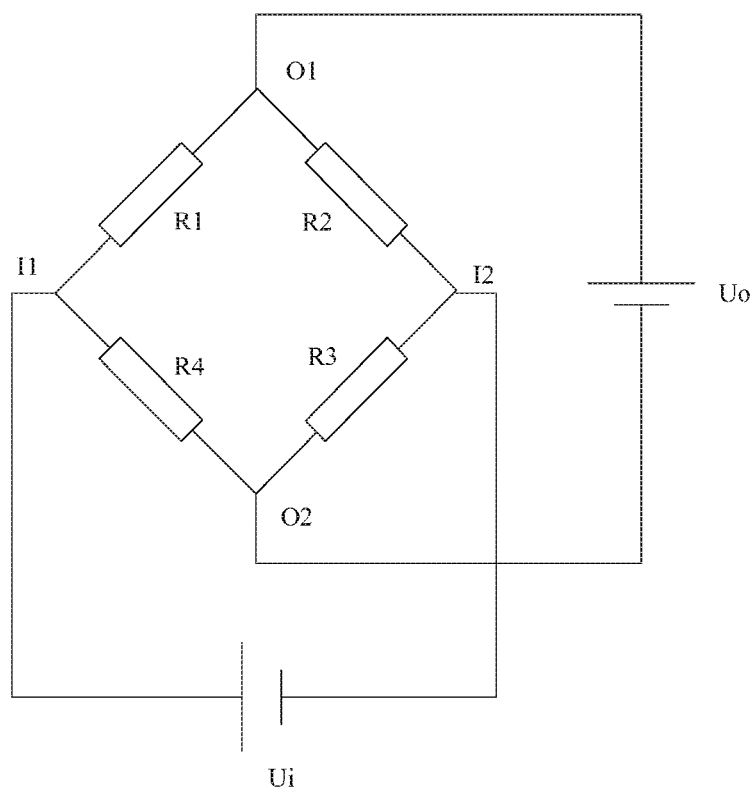
FIG. 16 is an equivalent circuit diagram of the force sensor shown in FIG. 15.

Exemplary, as shown in FIG. 15 and FIG. 16, the force sensor is a Wheatstone bridge force sensor, and FIG. 15 is a structural schematic diagram of a force sensor provided by an embodiment of the present disclosure and FIG. 16 is an equivalent circuit diagram of the force sensor shown in FIG. 15. The Wheatstone bridge force sensor includes a first input I1, a second input I2, a first output O1, a second output O2, a first force-sensitive resistor R1 connected in series between the first input I1 and the first output O1, a second force-sensitive resistor R2 connected in series between the first output O1 and the second input I2, a third force-sensitive resistor R3 connected in series between the second input I2 and the second output O2, and a fourth force-sensitive resistor R4 connected in series between the second output O2 and the first input I1.

The shapes of the first force-sensitive resistor R1, the second force-sensitive resistor R2, the third force-sensitive resistor R3, and the fourth force-sensitive resistor R4 may be various. Exemplarily, as shown in FIG. 16, the force sensor has a first extending direction x and a second extending direction y. The first extending direction x intersects the second extending direction y. An extending length of the first force-sensitive resistor R1 from a first end a to a second end a' has a greater component in the first extending direction x than a component thereof in the second extending direction y. An extending length of the second force-sensitive resistor R2 from a first end b to a second end b' has a greater component in the second extending direction y than a component thereof in the first extending direction x. An extending length of the third force-sensitive resistor R3 from a first end c to a second end c' has a greater component in the first extending direction x than a component thereof in the second extending direction y. An extending length of the fourth force-sensitive resistor R4 from a first end d to a second end d' has a greater component in the second extending direction y than a component thereof in the first extending direction x. This arrangement not only allows the first force-sensitive resistor R1 and the third force-sensitive resistor R3 to sense a strain in the first extending direction x, the second force-sensitive resistor R2 and the fourth force-sensitive resistor R4 to sense a strain in the second extending direction y, but also allows an area of the entire force sensor to be relatively small, being less influenced by the temperature. When the display panel is not subjected to a compressive stress perpendicular to the plane where the display panel is located, a ratio of the resistance of the first force-sensitive resistor R1 to the resistance of the second force-sensitive resistor R2 is equal to a ratio of the resistance of the fourth force-sensitive resistor R4 to the resistance of the third force-sensitive resistor R3, the bridge reaches a balanced status, and the voltage value at the output O1 is equal to the voltage value at the second output O2. When the display panel is subjected to a compressive stress perpendicular to the plane where the display panel is located, the above-mentioned four force-sensitive resistors are all deformed, resulting in change of the resistance value of each force-sensitive resistor, and the balanced status of the bridge is broken, that is, the ratio of the resistance of the first force-sensitive resistor R1 to the resistance of the second force-sensitive resistor R2 is not equal to the ratio of the resistance of the fourth force-sensitive resistor R4 to the resistance of the third force-sensitive resistor R3, and the voltage value at the first output O1 is not equal to the voltage value at the output O2, the difference between the voltage value at the first output O1 and the voltage value at the output O2 has a corresponding relationship with the force applied on the display panel. During the force detection process, the corresponding force value can be obtained by acquiring the voltage value at the first output O1 and the voltage value at the second output O2.

It should be noted that, in the above embodiments, the structure of the display panel is described by taking the force sensor made of semiconductor material as an example. However, the material for manufacturing the force sensor will not be limited by the embodiments of the present disclosure, and in other implementable manners, the force sensor may be made of other materials, for example, as for the force sensor structure shown in FIG. 15, the force-sensitive resistor can be made of metal or indium tin oxide material so as to form a serpentine resistor, which can also achieve the force sensor.

Figure 17:
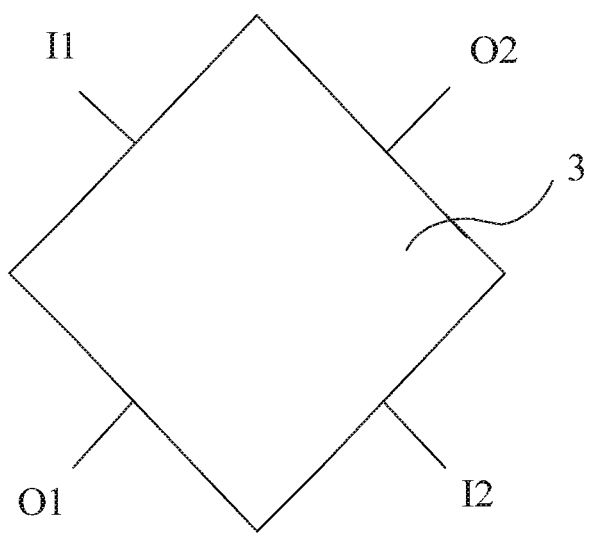
FIG. 17 is a structural schematic diagram of another force sensor provided by an embodiment of the present disclosure.

In one embodiment, as shown in FIG. 17, the force sensor is a silicon piezoresistive force sensor, and FIG. 17 is a structural schematic diagram of another force sensor provided by an embodiment of the present disclosure. The silicon piezoresistive force sensor may be a quadrilateral structure, and its four edges are respectively connected to the first input I1, the second input I2, the first output O1, and the second output O2. The first input I1 and the second input I2 are respectively connected to two opposite edges, and the first output O1 and the second output O2 are respectively connected to the other two opposite edges. The first input I1 and the second input I2 apply a bias voltage to the silicon piezoresistive force sensor, and when the display panel is subjected to a compressive stress perpendicular to the plane where the display panel is located, the resistance value of the silicon piezoresistive force sensor changes, the output signals of the first output O1 and the second output O2 correspondingly change, and the force applied to the silicon piezoresistive force sensor is detected by the voltage changes at the first output O1 and the second output O2.

Figure 18:
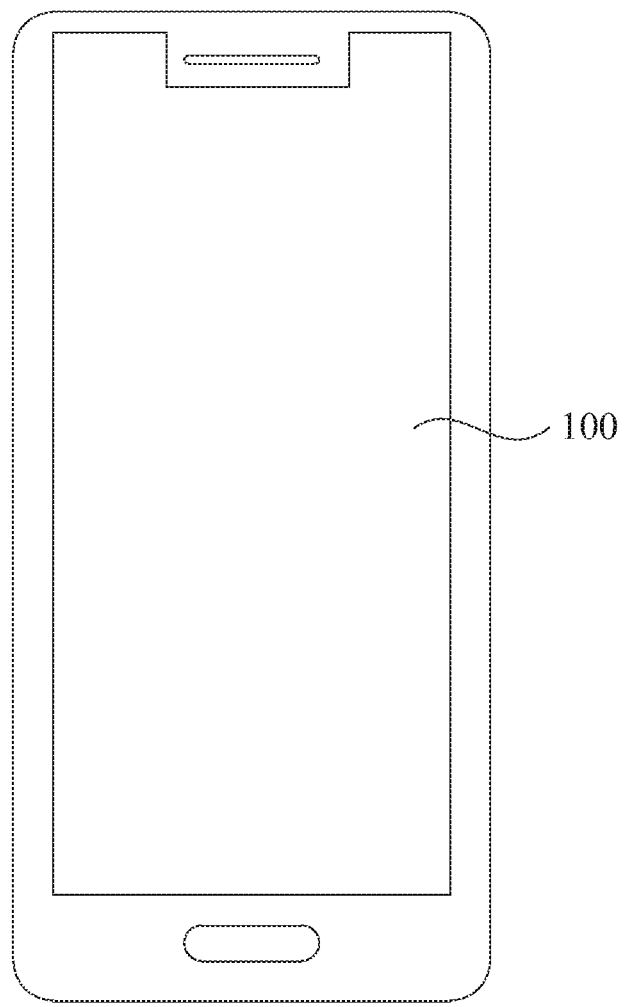
FIG. 18 is a structural schematic diagram of a display device provided by an embodiment of the present disclosure.

The present disclosure further provides a display device 100, as shown in FIG. 18, and the display device 100 includes the above-described display panel, and FIG. 18 is a structural schematic diagram of a display device provided by an embodiment of the present disclosure.

The structure and principle of the display panel are the same as those in the above embodiments, and will not be further described herein. The display device may be any electronic device having a display function, such as a touch screen display, a cellphone, a tablet computer, a notebook computer, an electronic book, a television or the like.

As for the display device provided by the embodiments of the present disclosure, the first output signal line and the second output signal line are disposed as far away from the driving circuit input line as possible, so that when the display panel is working, it is avoided that the force detection signal transmitted on the first output signal line and the second output signal line of the force sensor is interfered by the signal transmitted on the driving circuit input line, thereby improving the accuracy of force detection.

The above description merely describes embodiments of the present disclosure, which are not intended to limit the present disclosure. Any modification, equivalent substitution, or improvement made within the principle of the present disclosure shall be included within the protection scope of present disclosure.

What is claimed is:

1. A display panel, comprising:
   a display area;
   a non-display area provided with a force sensor and a driving circuit, wherein the driving circuit comprises a plurality of cascaded shift register units, and the force sensor is disposed between two adjacent shift register units of the plurality of cascaded shift register units;
   a first input signal line connected to a first input of the force sensor;
   a second input signal line connected to a second input of the force sensor;
   a first output signal line connected to a first output of the force sensor;
   a second output signal line connected to a second output of the force sensor; and
   a driving circuit input line is connected to an input of the driving circuit;
   wherein
   the display area and the non-display area are arranged in a row direction,
   an orthogonal projection of the first input signal line on the display panel is a first input signal line projection;
   an orthogonal projection of the second input signal line on the display panel is a second input signal line projection;
   an orthogonal projection of the first output signal line on the display panel is a first output signal line projection;
   an orthogonal projection of the second output signal line on the display panel is a second output signal line projection; and an orthogonal projection of the driving circuit input line on the display panel is a driving circuit input line projection; and
   a distance between the first output signal line projection and the driving circuit input line projection is at least 30 μm; and
   a distance between the second output signal line projection and the driving circuit input line projection is at least 30 μm,
   wherein the first input signal line projection or the second input signal line projection is disposed between the first output signal line projection and the driving circuit input line projection, and the first input signal line projection or the second input signal line projection is disposed between the second output signal line projection and the driving circuit input line projection.

2. The display panel according to claim 1, wherein the first input signal line projection and the second input signal line projection are disposed between the first output signal line projection and the driving circuit input line projection, and the first input signal line projection and the second input signal line projection are disposed between the second output signal line projection and the driving circuit input line projection.

3. The display panel according to claim 1, wherein the non-display area comprises a first edge and a second edge which are arranged along the row direction and extend in a column direction;
   a distance between the first input signal line projection and the first edge is a first input signal line distance; a distance between the second input signal line projection and the first edge is a second input signal line distance;
   a distance between the first output signal line projection and the first edge is a first output signal line distance; and
   a distance between the second output signal line projection and the first edge is a second output signal line distance;
   the first input signal line distance is greater than at least one of the first output signal line distance or the second output signal line distance; and
   the second input signal line distance is greater than at least one of the first output signal line distance or the second output signal line distance.

4. The display panel according to claim 1, wherein the number of the force sensor is more than one, the number of the first output signal line is more than one, and the number of the second output signal line is more than one;
   the more than one first output signal lines are connected to first outputs of the more than one force sensors in one-to-one correspondence, and the more than one second output signal lines are connected to second outputs of the more than one force sensors in one-to-one correspondence.

5. The display panel according to claim 4, wherein the number of the first input signal line is one and the number of the second input signal line is one;
   the one first input signal line is electrically connected to the first input of each of the more than one force sensors; and
   the one second input signal line is electrically connected to the second input of each of the more than one force sensors.

6. The display panel according to claim 1, wherein the driving circuit input line, the first input signal line, the second input signal line, the first output signal line and the second output signal line are disposed on a side of the plurality of cascaded shift register units away from the display area.

7. The display panel according to claim 1, wherein the force sensor is a Wheatstone bridge force sensor, wherein the Wheatstone bridge force sensor comprises a first input, a second input, a first output, a second output, a first force-sensitive resistor connected in series between the first input and the first output, a second force-sensitive resistor connected in series between the first output and the second input, a third force-sensitive resistor connected in series between the second input and the second output, and a fourth force-sensitive resistor connected in series between the second output and the first input.

8. The display panel according to claim 1, wherein the force sensor is a silicon piezoresistive force sensor.

9. A display device, comprising:
a display panel, wherein the display panel comprises:
a display area;
a non-display area provided with a force sensor and a driving circuit, wherein the driving circuit comprises a plurality of cascaded shift register units, and the force sensor is disposed between two adjacent shift register units of the plurality of cascaded shift register units;
a first input signal line connected to a first input of the force sensor;
a second input signal line connected to a second input of the force sensor;
a first output signal line connected to a first output of the force sensor;
a second output signal line connected to a second output of the force sensor; and
a driving circuit input line is connected to an input of the driving circuit;
wherein
the display area and the non-display area are arranged in a row direction,
an orthogonal projection of the first input signal line on the display panel is a first input signal line projection; an orthogonal projection of the second input signal line on the display panel is a second input signal line projection; an orthogonal projection of the first output signal line on the display panel is a first output signal line projection; an orthogonal projection of the second output signal line on the display panel is a second output signal line projection; and an orthogonal projection of the driving circuit input line on the display panel is a driving circuit input line projection; and
a distance between the first output signal line projection and the driving circuit input line projection is at least 30 µm; and a distance between the second output signal line projection and the driving circuit input line projection is at least 30 µm,
wherein the first input signal line projection or the second input signal line projection is disposed between the first output signal line projection and the driving circuit input line projection, and the first input signal line projection or the second input signal line projection is disposed between the second output signal line projection and the driving circuit input line projection.

10. A display panel, comprising:
a display area;
a non-display area provided with a force sensor and a driving circuit, wherein the driving circuit comprises a plurality of cascaded shift register units, and the force sensor is disposed between two adjacent shift register units of the plurality of cascaded shift register units;
a first input signal line connected to a first input of the force sensor;
a second input signal line connected to a second input of the force sensor;
a first output signal line connected to a first output of the force sensor;
a second output signal line connected to a second output of the force sensor; and
a driving circuit input line is connected to an input of the driving circuit;
wherein
the display area and the non-display area are arranged in a row direction,
an orthogonal projection of the first input signal line on the display panel is a first input signal line projection; an orthogonal projection of the second input signal line on the display panel is a second input signal line projection;
an orthogonal projection of the first output signal line on the display panel is a first output signal line projection; an orthogonal projection of the second output signal line on the display panel is a second output signal line projection; and an orthogonal projection of the driving circuit input line on the display panel is a driving circuit input line projection; and
a distance between the first output signal line projection and the driving circuit input line projection is at least 30 µm; and
a distance between the second output signal line projection and the driving circuit input line projection is at least 30 µm,
wherein the force sensor is a Wheatstone bridge force sensor, wherein the Wheatstone bridge force sensor comprises a first input, a second input, a first output, a second output, a first force-sensitive resistor connected in series between the first input and the first output, a second force-sensitive resistor connected in series between the first output and the second input, a third force-sensitive resistor connected in series between the second input and the second output, and a fourth force-sensitive resistor connected in series between the second output and the first input.

* * * * *